United States Patent [19]

Lardy et al.

[11] 4,219,828
[45] Aug. 26, 1980

[54] MULTIDRAIN METAL-OXIDE-SEMICONDUCTOR FIELD-EFFECT DEVICE

[76] Inventors: Jean-Louis Lardy, Lotissement les Iris no. 23, Le Versoud-Domène, France, 38420; Jacques Majos, 4, Rue du Dauphine, Lannion, France, 22300

[21] Appl. No.: 966,502

[22] Filed: Dec. 4, 1978

[30] Foreign Application Priority Data

Dec. 6, 1977 [FR] France .................. 77 36720

[51] Int. Cl.² .................................... H01L 29/80
[52] U.S. Cl. .................................. 357/22; 357/23; 357/41; 357/36
[58] Field of Search ............. 357/22, 23, 41, 36

[56] References Cited

U.S. PATENT DOCUMENTS 4,015,278   3/1977   Fukuta .................. 357/55

*Primary Examiner*—E. Wojciechowicz
*Attorney, Agent, or Firm*—Abraham A. Saffitz

[57] ABSTRACT

A metal-oxide-semiconductor field-effect device for constituting a single logic inverter stage. It includes a multidrain transistor operating in enhancement mode and a load transistor, both of monochannel metal-oxide-semiconductor structure. The inverter transistor comprises a single gate region and several drain regions. The single gate region and the single channel region of the inverter multidrain transistor are superimposed on both implantation planes separated by a thin insulating layer, entirely surround each drain region of the inverter multidrain transistor and are entirely surrounded by the single source region of the inverter multidrain transistor.

6 Claims, 20 Drawing Figures

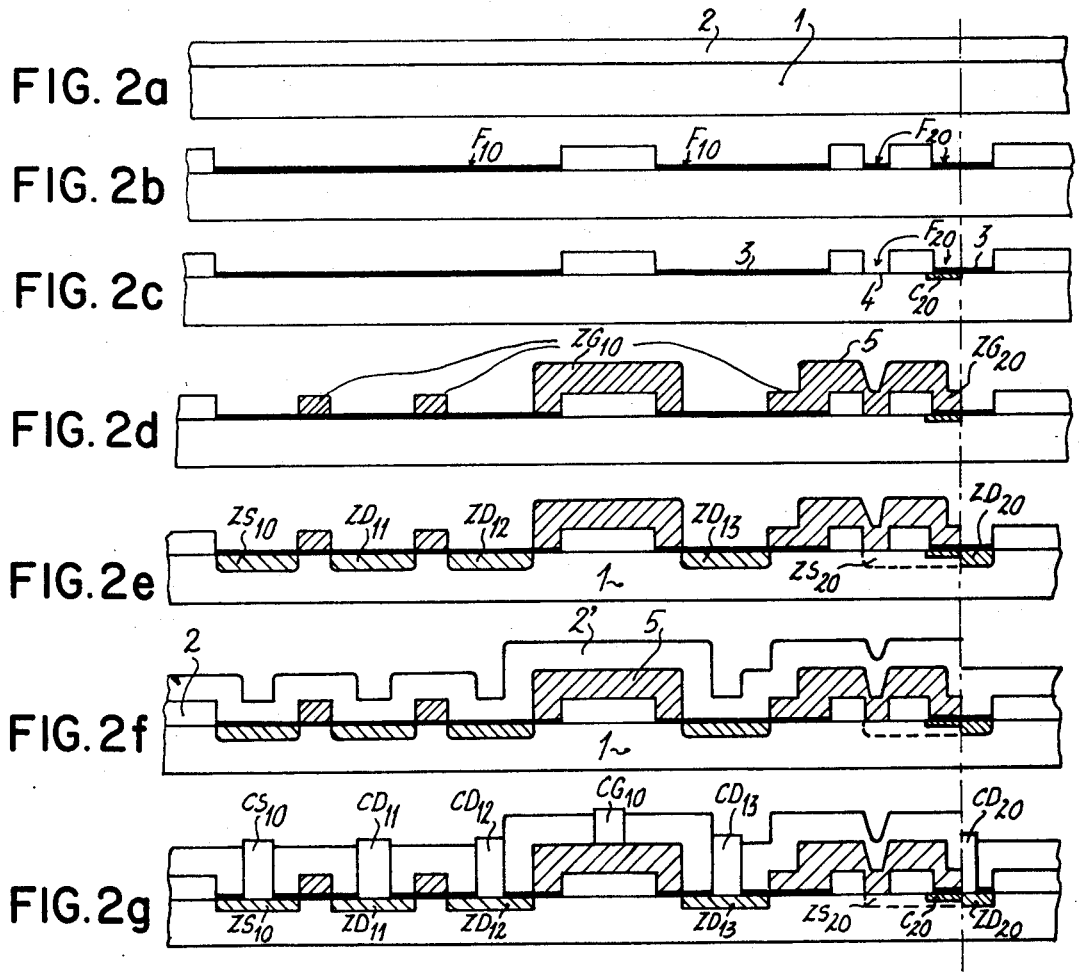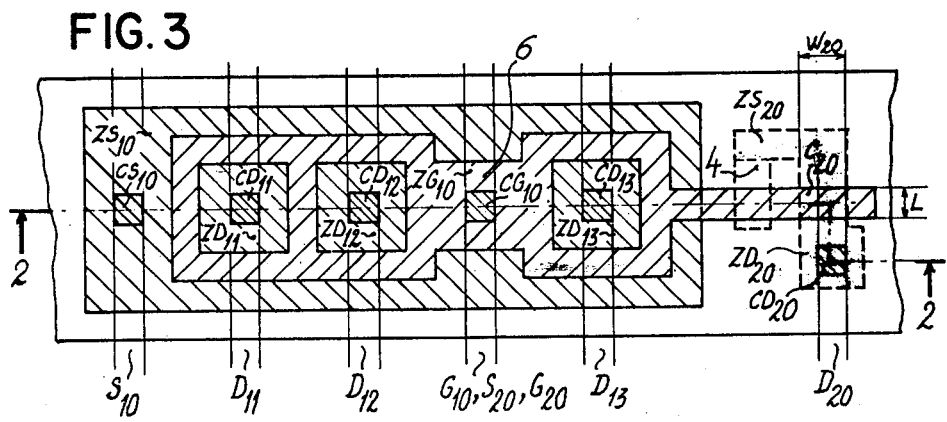

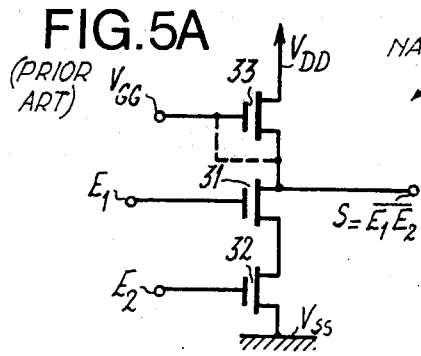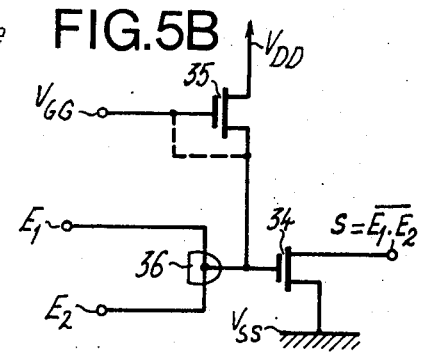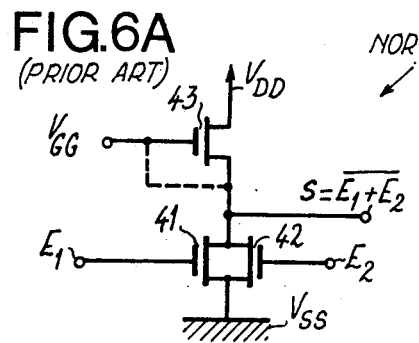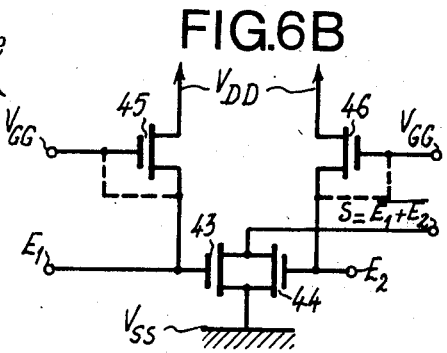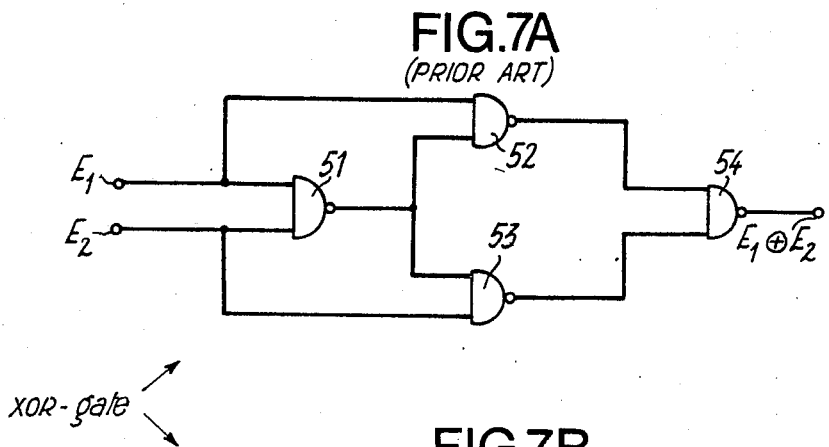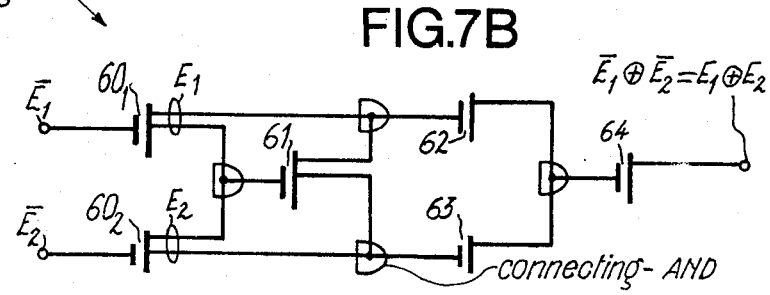

MULTIDRAIN METAL-OXIDE-SEMICONDUCTOR FIELD-EFFECT

CROSS REFERENCES TO RELATED APPLICATIONS

Applicants hereby make cross references to their French Patent Application No. PV 77 36720, filed Dec. 6, 1977 and claim Priority thereunder following the provisions of 35 U.S.C. 119.

BACKGROUND OF THE INVENTION

1. Field of the Invention

The present invention relates to a metal-oxide-semiconductor field-effect device with integrated monochannel structure which comprises an inverter transistor of the enhancement mode operation type and an active load constituted by a load transistor.

2. Description of the Prior Art

For realizing a logic device of the aforementioned type or a simple inverter stage, it is known from prior art to use a load transistor, the source electrode of which and possibly the gate electrode are connected to the drain electrode of the inverter transistor. The structure of such a logic device comprises generally a n-type conductivity channel, to which reference shall be made in the following, in order to obtain, on one hand, a small propagation time because the mobility of the negative carriers or electrons in a n-type channel is greater than that of the positive carriers or holes in a p-type conductivity channel and, on the other hand, a relatively high scale integration.

When a voltage equal to the high level "1" is applied to the input terminal of the logic device or to the gate electrode terminal of the inverter transistor, the level of the output terminal of the device or the drain electrode terminal of the inverter transistor is low "0" when the load transistor and the inverter transistor are both turned-on. For a given integration technique, i.e. for a predetermined length of the transistor channels, the simultaneous turning-on takes place when the input terminal voltage of the logic device is greater than the threshold voltage of the inverter transistor.

The width L of the inverter transistor channel is very great relative to that of the load transistor. The result is that the propagation time of the inverter transistor, the channel of which is much wider, is smaller than that of the load transistor.

The switching speed of the logic device and the realization of a steep slope of its transfer function which is equal to the ratio of drain-source voltage and the gate-source voltage of the inverter transistor, are then determined by the propagation time of the load transistor the channel of which is less wide than that of the inverter transistor.

In order to achieve a short propagation time of the logic device, which amounts to providing a high drain-source current of the load transistor, it is necessary to constitute a load transistor having a very wide channel, which leads to a much greater channel width of the inverter transistor.

Thus, for an integrated MOS transistor circuit in which the drain region and the source region are on a first implantation plane of a substrate wafer and in which the gate region is on a second implantation plane separating by a thin insulating silicon dioxide layer below the first implantation plane, the integration degree of the logic devices each comprising an inverter MOS transistor decreases as the switching speed of the logic device increases.

OBJECT OF THE INVENTION

The principal object of the present invention is to provide a logic MOS device of the aforementioned type wherein the ratio of switching speed to integration degree is optimized for a given integration technique which, for an integrated circuit having a determined number of logic gates, contributes to obtaining very great channel widths of the inverter transistors having an integration degree greater than that of the known device.

SUMMARY OF THE INVENTION

Accordingly, the invention provides a metal-oxide-semiconductor field-effect device in which a first implantation plane on a major face of a substrate wafer of semiconductor material of a determined conductivity type comprises the source regions and the drain regions of the opposite conductivity type of an inverter multidrain transistor operating in enhancement mode and a load transistor, both of monochannel metal-oxide-semiconductor structure, and in which a second implantation plane of a polycristalline silicon layer comprises the gate regions of said inverter multidrain transistor and said load transistor and is separated by a thin insulating layer below said first implantation plane, the single gate region and the single channel region of said inverter multidrain transistor being superimposed, entirely surrounding each drain region of said inverter multidrain transistor and being entirely surrounded by the single source region of said inverter multidrain transistor.

In the following, the inverter transistor as defined above shall be referred to as a multidrain transistor.

In contrast to a known logic device or a known simple inverter stage, in which the external lead connections to its input terminal and to its single output terminal respectively, form connecting-OR-not functions or connection-AND-not functions depending on the used type of device, a logic device embodying the invention has external lead connections to its single input terminal of the gate contact electrode of the inverter transistor on one hand and to its output terminals or the drain contact electrodes of the inverter transistor on the other, constituting connecting-AND functions or gates.

The number of drains of the inverter transistor then equals the fan out of the device or single inverter stage.

The gate region of the inverter transistor surrounding each drain region, which is superimposed on the very wide channel region between the drain regions and the single source region, makes it possible to obtain advantageously logic devices having switching speeds belonging within the generally desired range, this being achieved with an integration degree of the inverter transistor substantially equal to the maximum integration degree of the selected implantation technique, whatever the propagation time of the logic device. In an integrated circuit with simple inverter stage having a multidrain inverter transistor embodying the invention, the geometrical structure of the inverter transistors is fixed once for all, and only the channel width between the drain and source regions of the load transistor depends on the given propagation time of the inverter stage, which is independent of the number of drain regions of the inverter transistor.

BRIEF DESCRIPTION OF THE DRAWING

The present invention will now be described in greater detail by way of several examples of embodiment with reference to and as illustrated in the corresponding accompanying drawings, in which:

FIGS. 2a to 2g are sectional views, taken along the broken line 2—2 in FIG. 3, showing the various production stages of the device according to a preferred implantation example;

FIG. 3 is a detailed sectional plan view of the device illustrated in FIG. 2;

FIGS. 5A and 5B illustrate the circuits of a NAND-gate with MOS transistors of prior art and with a single inverter multidrain transistor according to the invention;

FIGS. 6A and 6B illustrate the circuits of a NOR gate with MOS transistors of prior art and according to the invention;

FIGS. 7A and 7B show the circuits of an exclusive-OR gate of prior art and according to the invention;

DESCRIPTION OF THE PREFERRED EMBODIMENTS

For the sake of a better understanding of the functional features of a multidrain MOS transistor, in the first instance a structural example of a logic gate embodying the invention which is provided with an inverter transistor having three drains, will be described.

Figure 1A:
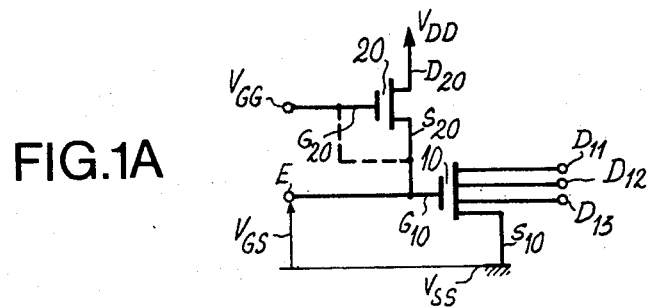
FIGS. 1A and 1B illustrate the schematic circuit and the equivalent functional and structural circuit of a single device or a single inverter stage embodying the invention.
Figure 1B:
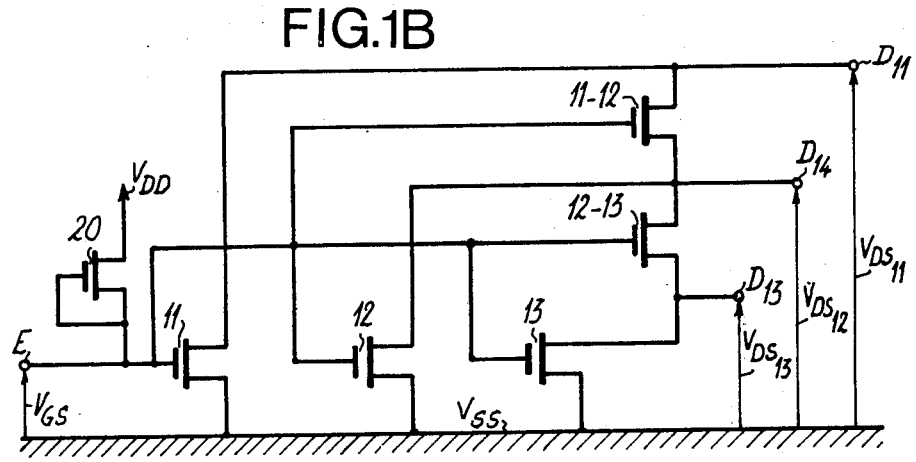

Such a logic gate is illustrated schematically in FIG. 1A and functionally in FIG. 1B with reference to the known MOS transistors each having a single drain.

The logic gate comprises a transistor 10, hereinafter called as inverter transistor, which controls output levels and which has three output drain terminals $D_{11}$, $D_{12}$ and $D_{13}$, a single gate terminal $G_{10}$ and a source terminal $S_{10}$ connected to the ground referenced voltage $V_{ss}$ and a load transistor 20 acting as current generator for the drain terminals of other multidrain transistors (not shown) previously connected to the gate terminal $G_{10}$, due to the fact that is feeds the gate terminal $G_{10}$ of the inverter transistor 10.

The inverter transistor 10 has an enhancement mode operation MOS structure with n-type conductivity channel, whilst the load transistor 20 has a depletion mode operation MOS structure with n-type conductivity channel, for example. The load transistor 20 has its drain terminal $D_{20}$ connected to the positive terminal $V_{DD}$ of the voltage supply, and its gate terminal $G_{20}$ is connected, in this embodiment, to its source terminal $S_{20}$ which is connected to the input terminal E which receives digital command signals applied to the gate terminal $G_{10}$ of the inverter transistor 10. In other embodiments, the load transistor may be of the enhancement mode operation type and/or may operate in unsaturated mode for which its gate is polarized to an appropriate voltage $V_{GG}$.

The structure of the logic gate with inverter transistor having three drains will appear more clearly from a description of a production example given with reference to FIGS. 2a to 2g and 3.

This production is carried out by planar technique, the various operations of which, namely masking, photoetching, oxidizing, deoxidizing and diffusion are known. It comprises the following phases for obtaining a logic gate with n-channel MOS transistor and polycristalline silicon gate such as shown in plan view in FIG. 3:

(a) On a p-type semiconductor substrate wafer 1 a thick layer of silicon dioxide 2 is grown, as shown in FIG. 2a;

(b) Windows $F_{10}$ and $F_{20}$ corresponding to the implantation locations respectively of the inverter transistor 10 and load transistor 20 are produced by means of a first masking in the course of which the thick silicon dioxide layer 2 is completely deoxidized and substituted by oxidation with thin layers 3 of silicon dioxide of approximately 1000 Å in the windows $F_{10}$ and $F_{20}$ as shown in FIG. 2b;

(c) second and third maskings to adjust the threshold voltage of the load transistor by ion implantation technique of n-type impurities through the thin layer 3 into the channel region $C_{20}$ of the depletion mode load transistor 20, and to define a first interconnecting plane in the window $F_{20}$ corresponding to the region of ohmic precontact 4 of the gate and source regions of the load transistor 20 obtained by deoxidation of the thin silicon dioxide layer 3, as shown in FIG. 2c and also by the shaded area of thin silicon dioxide layer in the load transistor of FIG. 3;

(d) fourth masking to deposit a layer of polycristalline silicon 5 of approximately 5000 Å defining the gate regions $ZG_{10}$ and $ZG_{20}$ of the inverter transistor 10 and load transistor 20 respectively, as shown in FIG. 2d; it will be noted that at the neighbourhood of the load transistor 20, the polycristalline silicon 5 is also deposited in the ohmic precontact region 4 in proximity of the source region $ZS_{20}$ in order to form the precontact between the gate and source regions of the load transistor 20;

(e) diffusion of n-type impurities into the substrate wafer 1 through the thin silicon dioxide layers 3 and by means of the polycristalline silicon 5 and the thick layer 2 acting as mask, so as to define on a first implantation plane the source regions $ZS_{10}$ and the square drain regions $ZD_{11}$, $ZD_{12}$ and $ZD_{13}$ of the inverter transistor 10 and the source region $ZS_{20}$ as well as the drain region $ZD_{20}$ of the load transistor 20, as shown in FIGS. 2e and 3; in the precontact region 4, a small quantity of the doping element is diffused through the polycristalline silicon 5 in order to lower its resistivity and, in consequence, to realize the ohmic precontact;

(f) deposition by a second oxidation of a thick silicon dioxide layer 2' protecting all regions of the logic gate as shown in FIG. 2f;

(g) fifth masking and second deoxidation as far as the source region $ZS_{10}$, drain regions $ZD_{11}$, $ZD_{12}$, $ZD_{13}$ and $ZD_{20}$ on the first implantation plane and as far as the gate region $ZG_{10}$ substantially on a second implantation plane separed by the thin insulating layers 3 below the first implantation plane, i.e. as far as the polycristalline silion 5, to define the sinks into which metal layers, usually made of aluminium, are deposited to form the contacts $CS_{10}$, $CD_{11}$, $CD_{12}$, $CD_{13}$, $CD_{20}$ and $CG_{10}$ of the aforementioned regions, as shown in FIG. 2g; the contact $CG_{10}$ is terminal electrode of the input of the logic gate and is also that of the source and gate zones of the load transistor 20; simultaneously with the deposition of the metal layers, the connection and terminal electrodes of the drains and of the gates of the transistors are formed, shown in thin lines in FIG. 3 or, more generally, when the logic gate is included in a complex integrated circuit, the metallic interconnections between the different logic gates are formed.

According to the embodiment shown in FIGS. 2 and 3, it is assumed that a passage for an interconnecting link, which is illustrated by the constriction 6, is superimposed on the gate region $ZG_{10}$ of the inverter transistor 10 between the drain regions $ZD_{12}$ and $ZD_{13}$, and also that the drain region $ZD_{20}$ of the load transistor 20 illustrated below the channel $C_{20}$ in FIG. 3 was not aligned with the other drain regions in order to reduce the implantation surface of the logic gate. Always, with reference to FIG. 3, the source region $ZS_{20}$ of the load transistor 20 is angled, so as to realize on one side its ohmic contact with the gate regions $ZG_{20}$ and $ZG_{10}$ in the region 4 and on the other side, its junction with the channel $C_{20}$ of width $W_{20}$.

Figure 4:
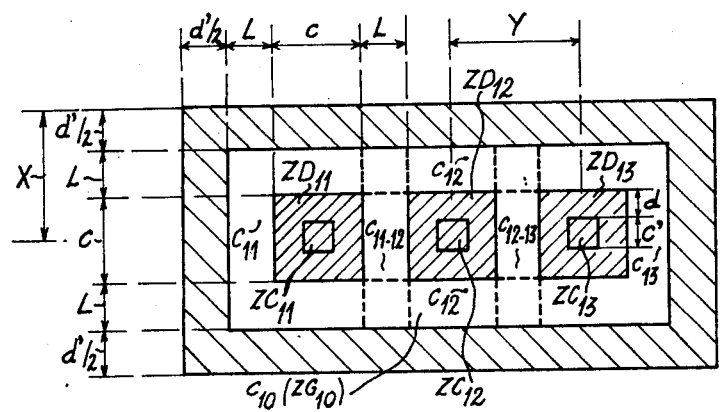
FIG. 4 is a simplified sectional plan view similar to FIG. 3, showing the principal implantation regions of an inverter transistor having three drains according to the invention.

Generally speaking, the inverter transistor 10 with three drains $D_{11}$, $D_{12}$ and $D_{13}$ has the structure schematically illustrated in plan view in FIG. 4. The channel $C_{10}$ of the inverter transistor 10 which adjoins from below the gate region $ZG_{10}$ surrounds completely the three drain regions $ZD_{11}$, $ZD_{12}$ and $ZD_{13}$. This channel $C_{10}$ can be subdivided into three basic channels $C_{11}$, $C_{12}$ and $C_{13}$, and two interconnecting channels $C_{11-12}$ and $C_{12-13}$ between the extreme drain region $ZD_{11}$ and the intermediate drain region $ZD_{12}$ and between the intermediate drain region $ZD_{12}$ and the other extreme drain region $ZD_{13}$ which define three basic inverter MOS transistors 11, 12 and 13 having common gate terminal and two interconnecting MOS transistors 11-12 and 12-13, as shown in the functional diagram of FIG. 1B.

All the channels $C_{11}$, $C_{12}$, $C_{13}$, $C_{11-12}$ and $C_{12-13}$ have an identical length L which is selected as being equal to the minimum length imposed by the production technique applied. The widths W of these channels are different and depend on their location within the structure. They are listed approximately in the following table, where c is the length of a side of the identical square drain regions $ZD_{11}$, $ZD_{12}$ and $ZD_{13}$:

|  | Basic inverter transistors | | | Interconnecting transistors | |
| --- | --- | --- | --- | --- | --- |
|  | 11 | 12 | 13 | 11–12 | 12–13 |
| W = channel width | 3c | 2c | 3c | c | c |

In accordance with the production technique, it is easy to deduce from the above table the channel widths of the basic inverter transistors i and the channel widths of the interconnecting transistors (i)-(i+1) for width i≠n for a logic gate composed of n drains embodying the invention, where i varies from 1 to n:

|  | Basic inverter transistors | | | Interconnecting transistors |
| --- | --- | --- | --- | --- |
|  | i = 1 | i ≠ i<br>i ≠ n | i = n | (i)-(i + 1) for<br>i ≠ n |
| W = channel width | 3c | 2c | 3c | c |

Thus, the drain of each basic inverter transistor i is equivalent to the drain of a basic inverter transistor i the source of which is at reference voltage $V_{SS}$ and to the drain of a interconnecting transistor (i)-(i+1) the source of which is the drain of the adjacent basic inverter transistor i+1.

It will be noted that, when compared with a MOS-type logic gate with inverter transistors according to prior art in which the transistors have an aligned region structure with separated gate regions, the logic gate according to the invention occupies a smaller area for a given channel width $W_i$. For a predetermined implantation surface, the W/L ratio on the average substantially higher than 2c/L is greater than that of a logic gate of prior art. It follows from this that a propagation time between the high and low logic levels is smaller than those of the known logic gates, because the resistance between the drain and the source electrodes of each transistor is inversely proportional to the corresponding W/L ratio.

In the case where the voltage between the gate and source $V_{GS}$ is lower than the threshold voltage $V_{TH}$ of the basic inverter transistors, i.e. at low level "0", each basic inverter transistor i is turned-off and the voltage $V_{DSi}$ between its drain electrode and the source terminal is at the lowest level of the interconnections to which it is linked, the level "0" having priority in each connection of a drain electrode and the associated links which form a connecting-AND. The interconnecting transistors (i)-(i+1) have drain voltages depending on the levels of their associated external links.

On the other hand, in the case where the voltage $V_{GS}$ is greater than the threshold voltage $V_{TH}$, i.e. at high level "1", all the basic inverter transistors are turned-on and their drain electrodes are at level "0", whatever the levels applied to the links to which they are connected respectively. Each interconnecting transistor (i)-(i+1) ensures the restoring of equilibrium of the drain voltages of the two adjacent basic inverter transistors i and i+1. The voltage between the drain electrode and the source electrode of the interconnecting transistors being very weak, the latter will turn-on in linear mode.

Referring now to FIGS. 5A and 6A, these show two known NAND and NOR logic gates of integrated n-type monochannel MOS structure. To the two input terminals $E_1$ and $E_2$ are connected the gate electrodes of two inverter transistors of the enhancement mode operation type 31 and 32 as shown in FIGS. 5A, 41 and 42 as shown is FIG. 6A.

In FIG. 5A, the source electrode of the inverter transistor 31, the drain electrode of which is connected to the output terminal S of the NAND gate, is connected to the drain electrode of the inverter transistor 32. In FIG. 6A the source electrodes of the inverter transistors 41 and 42 are at the reference voltage $V_{SS}$ and the drain electrodes of these inverter transistors are connected to the output terminal S of the NOR gate.

These NAND and NOR gates are as called the static consumption type gates because they have a single load transistor 33 (FIG. 5A), 43 (FIG. 6A), for example of the depletion mode operation type, the source electrode of which is connected at least to the drain electrode of an inverter transistor 31 (FIG. 5A), 41 and 42 (FIG. 6A), and the gate electrode of which is at a reference voltage $V_{GG}$ when operating in unsaturated mode or is connected to its source electrode when operating in saturated mode, as shown by short broken line in FIGS. 5A and 6A.

According to prior art, a NAND logic gate with m input terminals, analogous to the one with two input terminals shown in FIG. 5A, is so conceived that each inverter transistor corresponding to an input terminal j with j varying from 1 to m, has its drain connected to the source electrode of the preceding inverter transistor $j-1$ and has its source electrode connected to the drain electrode of the following inverter transistor $j+1$. In this case, the single load transistor 33 feeds by its source electrode all the inverter transistors 1 through m connected in cascade by means of a predetermined drain-source current. The rise time of an inverter transistor depends on the drain-source resistances of the preceding inverter transistors. More precisely, the propagation time of a prior-art NAND gate is proportional to the number m of inverter transistors or, in other words, its switching speed decreases as m increases; assuming that all inverter transistors have identical dynamic characteristics. When such a NAND gate is incorporated in an integrated circuit such as a decoder having m input terminals, it is found that its relatively long propagation time may cause a delay in the information transmission of substantial magnitude and detrimental to operation.

By contrast, a NAND logic gate embodying the invention having m input terminals does not have these drawbacks. It only has one multidrain inverter transistor 34 fed by its load transistor 35 as shown in FIG. 5B, with reference to a NAND gate having two input terminals $E_1$ and $E_2$. In this case, the connection of the m input terminals to the input or gate electrode of the inverter transistor 34 constitutes a connecting-AND gate 36. The propagation time of the NAND gate is independent of the number m and is fixed once for all.

As with the NAND gate for which it appears that the implantation surface of those embodying the invention comprising a single inverter transistor is smaller than the implantation surface of those according to prior art, a NOR gate embodying the invention such as the one shown in FIG. 6B with two input terminals $E_1$ and $E_2$, likewise has a smaller implantation surface than the one of the NOR gate shown in FIG. 6A. In fact, the common source region of the inverter transistors 43 and 44, which are fed by the load transistors 45 and 46 respectively or, more generally, the common source region of m inverter transistors constituting a m input terminal NOR gate and connected in parallel, surrounds completely the gate region or the channel region of each inverter transistor which also surrounds the drain region of said inverter transistor. In this case, the connection capacitance to the respective drain output terminal of each inverter transistor is lower than that of the inverter transistors incorporated in the known NOR gates.

It results from the preceding that, when realizing a determined logical function, an integrated circuit with MOS multidrain transistor embodying the invention occupies a smaller implantation surface than one of an integral circuit with known MOS structure, and has moreover a greater switching speed for a predetermined implantation technique. These advantages will be more clearly apparent from reading the description of two examples of embodiment of more complex logic functions such as the exclusive-OR and that of a D-bistable latch flip-flop. It is assumed that the input and output terminals of the integrated circuits with multidrain transistors are connected to other integrated circuits with multidrain transistors according to the connection characteristics of the logic gates embodying the present invention.

Referring now to FIG. 7A, one considers a logic with NAND gates for realizing a known exclusive-OR gate or XOR-gate. The structure of the XOR-gate has four NAND gates 51, 52, 53 and 54, and consequently eight inverter MOS transistors of a known type. Compared with this structure, the XOR-gate structure embodying the invention and shown in FIG. 7B comprises only six multidrain trnsistors $60_1$, $60_2$ and 61 to 64 or six gate electrodes of inverter transistors. The transistors $60_1$ and $60_2$ belong to an input interface to effect the simple inverting functions of the input terminals $E_1$ and $E_2$, whilst the transistors 61 to 64 realize logical functions analogous to that of the NAND gates 51 to 54 in FIG. 7A.

Figure 8A:
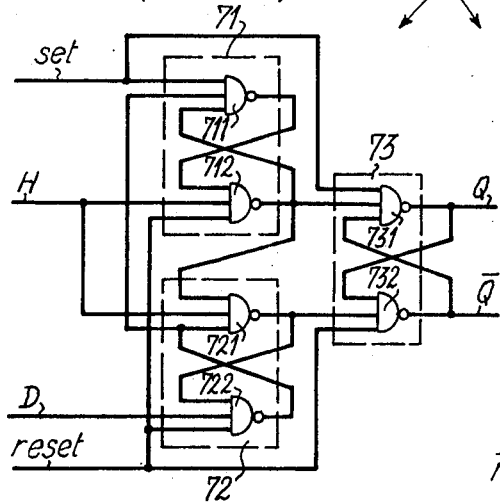
FIGS. 8A and 8B illustrate the circuits of a D-type flip-flop of prior art and according to the invention.

Another example of integrated circuit constituting a D-type flip-flop is shown in FIG. 8A according to prior art. It comprises three RS-type flip-flops referenced 71, 72 and 73 with $2\times 3=6$ input terminals, each composed of two NAND gates 711 and 712, 721 and 722, 731 and 732, respectively. In FIG. 8A, as well as in FIG. 8B, reference D, H, set and reset designate respectively the input terminals of the D-flip-flop which receive digital incoming signal, clock signal, low-level "1" reset signal and high-level "0" reset signal, respectively, while Q and $\overline{Q}$ represent complementary outputting signals transmitted from the D-flip-flop.

Figure 8B:
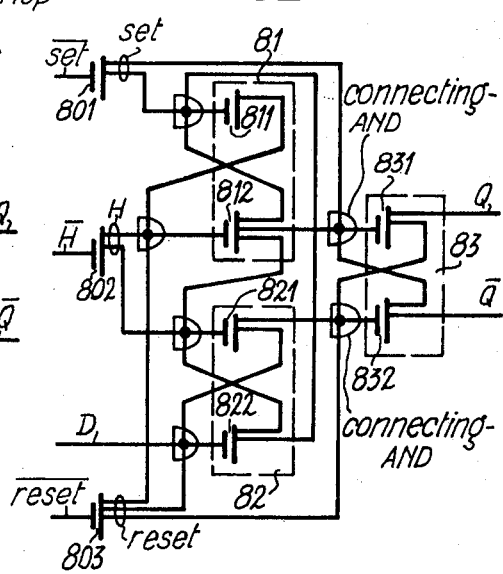

The D-flip-flop illustrated in FIG. 8B has a structure comprising multidrain transistors embodying the invention. The transistors 801, 802 and 803 belong to an input interface to effect the simple inverting functions of the singals $\overline{set}$, $\overline{H}$ and $\overline{reset}$, whilst the transistors 811 and 812, 821 and 822, 831 and 832 constitute RS-type flip-flops 81, 82 and 83 having functions analogous to those of the RS flip-flops 71, 72 and 73 of FIG. 8A.

It will be noted that the FIGS. 7B and 8B the load transistors for connection to the inverter multidrain transistors are omitted in order to complicate the figures, and that the connecting-AND gate are shown symbolically, as forming the connections of the output drain electrodes of the inverter multidrain transistors.

In these two embodiments of integral circuits, it is seen that each multidrain transistor has a number of drains equal to its fan-out, i.e. to the number of multidrain transistors the input or gate terminals of which are connected to the output or drain terminals of the logic gate which it constitutes.

It will also be noted, as already stated, that the switching speed of a gate being dependent on the W/L ratio of the load transistor, i.e. on the available current for charging the gate-source input capacitance of the inverter transistor of the gate, a logic gate embodying the invention and having a structure with a multidrain transistor will occupy a much smaller area than a logic gate having a structure comprising known MOS transistors, for a predetermined W/L ratio of the load transistor.

In practice, the widths W of the channel regions of the inverter multidrain transistors being sufficiently great to obtain a range of propagation times which usually corresponds to the loading currents between the drain electrode and the source electrode of the load transistor smaller than 200 μa, the geometry of the inverter transistors is then fixed, whatever use they may be put to. Each inverter transistor occupies a surface determined by the selected implantation technique. Only the geometrical parameters of each load transistor are modified in dependence upon the logic functions and the connections to be realized in the integrated circuit, contrary to the logic gates having known MOS transistors for which their implantation surfaces depend additionally on the channel widths of the inverter transistors.

The interconnecting transistors (i)–(i+1) of each inverter multidrain transistor do not restrict the normal operation of the logic gate but contribute to the voltage balancing of the output drain terminals at the low level "0" when the channel widths of the load transistor to which they are connected are different.

Figure 9:
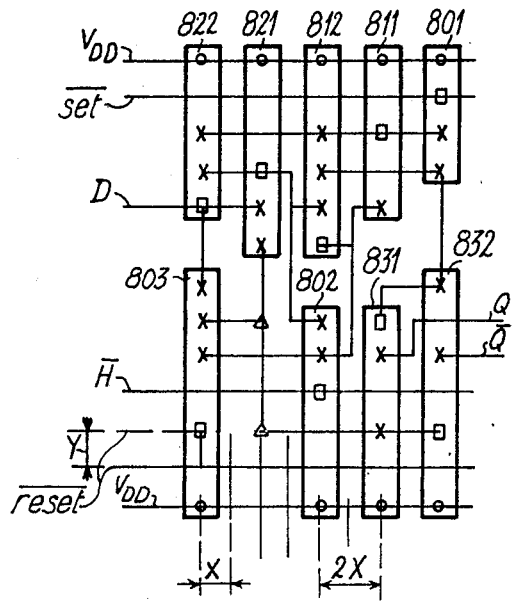
FIG. 9 schematically illustrates a preferred implantation of the D-flip-flop in FIG. 8B.

The FIG. 9 shows schematically an implantation embodiment of the multidrain transistors of the D-flip-flop shown in FIG. 8B. The squares and crosses symbolize the contact locations of the gate and drain electrodes of each multidrain transistor, the circles indicate the contact locations of the drain electrodes of the load transistors and the triangles the extremities of a connection link diffused on an interconnection plane adjoining the electrodes from below. The geometric pitch of the implantation network depend on the used implantation technique. Each location of an electrode contact is centered on a node of the network.

According to the configuration shown in FIG. 9, the pitches in horizontal and vertical directions are as follows:

pitch $X = c'/2 + d + L + d'/2$ pitch $Y = c' + 2d + L$

With reference to FIG. 4, the aforementioned parameters are:
- $c'$ = dimension of the side of the square surface of a contact;
- $d = (c-c')/2$ = distance between a contact and the gate region of an inverter transistor;
- $L$ = length of the gate region;
- $d'$ = distance between the gate regions of two adjacent inverter transistors.

The contact location of the gate region is implanted practically in any node of the network belonging to the gate surface, i.e. the contact of the input terminal of a gate with multidrain transistors is located practically in any arbitrarily selected location of almost the whole of the implantation surface of the logic gate, which advantageously leads to a high scale integration.

What we claim is:

1. A multidrain MOS field-effect device comprising:
   a semiconductor substrate of a determined conductivity type having a major face defining a first implantation plane;
   a source region included in said first implantation plane and being of the opposite conductivity type to said semiconductor substrate;
   a plurality of separated drain regions included in said first implantation plane and being of said opposite conductivity type;
   a single channel region included in said semiconductor substrate of said determined conductivity type, entirely surrounding each of said drain regions and being surrounded by said source region;
   a thin insulating layer above at least of said channel region; and
   a second implantation layer composed of polycristalline silicon and defining a single gate region which is above said thin insulating layer and said single channel region;
   said source region, said plurality of drain regions and said gate region forming a multidrain transistor which has its gate region entirely surrounding over said drain regions and being surrounded over said source region and which comprises a pluraltiy of separated drain electrodes in ohmic contact with said drain regions respectively.

2. A device according to claim 1 in which said drain regions are identical and are aligned on said first implantation plane, each intermediate drain region and said source region of said inverter multidrain transistor consituting an intermediate metal-oxide-semiconductor type transistor having a width of channel region substantially equal to two thirds of the channel region width of an extremity metal-oxide-semiconductor type transistor comprising an extremity drain region and said source region of said inverter multidrain transistor, each pair of adjacent drain regions of said inverter multidrain transistor constituting an interconnecting metal-oxide-semiconductor type transistor having a channel region width substantially equal to one third of said channel region width of each said extremity transistor.

3. A device according to claim 1 in which the integration degree of said inverter multidrain transistor is substantially equal to the maximum integration degree of a given implantation technique whatever the propagation time of said device, and in which the channel region width between said drain region and said source region of said load transistor is determined as a function of the propagation time of said device which is independent of the number of said drain regions of said inverter transistor.

4. A multidrain MOS field-effect device including an inverter multidrain transistor and a load transistor, at least the drain of said load transistor being connected to the gate of said inverter multidrain transistor, said inverter multidrain transistor comprising:
   a source region and a plurality of separated drain regions included in a first implanation plane defined by a major face of a semiconductor substrate of a determined conductivity type, said source region and said drain regions being of the opposite conductivity type of said semiconductor substrate;
   a single channel region included in said semiconductor substrate of said determined conductivity type, entirely surrounding each of said drain regions and being surrounded by said source region;
   a thin insulating layer above at least of said channel region; and
   a single gate region composed of polycrisalline silicon and forming a second implantation layer which entirely surrounds over said drain region and is surrounded over said source region; said load transistor comprising;
   a source region included in said first implantation plane and being of said opposite semiconductor type;
   a drain region included in said first implantation plane, being of said opposite semiconductor type and being in ohmic contact with an extreme portion of said single gate region of said inverter multidrain transistor; and a gate region composed of polycristalline silicon and included in said second implantation layer.

5. A device according to claim 4 in which said extremity portion of said single gate region of said inverter multidrain transistor is the gate region of said load transistor.

6. A device according to claim 4 in which the integration degree of said inverter multidrain transistor is substantially equal to the maximum integration degree of a given implantation technique whatever the propagation time of said device, and in which the channel region width between said drain region and said source region of said load transistor is determined as a function of the propagation time of said device which is independent of the number of said drain regions of said inverter transistor.

* * * * *